United States Patent [19]

Ammon

[11] 3,868,166

[45] Feb. 25, 1975

[54] PRINTED CIRCUIT BOARD CONNECTOR HAVING CONTACTS ARRANGED IN A STAGGERED GRID ARRAY

[75] Inventor: John Preston Ammon, Dallas, Tex.

[73] Assignee: Elfab Corporation, Dallas, Tex.

[22] Filed: July 16, 1973

[21] Appl. No.: 379,640

[52] U.S. Cl. .......................... 339/176 MP, 339/17 L

[51] Int. Cl. ............................................. H05k 1/07

[58] Field of Search ........ 339/17 L, 17 LM, 75 MP, 339/176 MP

[56] References Cited

UNITED STATES PATENTS

| | | | |
|---|---|---|---|
| 3,474,387 | 10/1969 | Krum et al. | 339/75 MP |
| 3,594,699 | 7/1971 | Jayne et al. | 339/176 MP X |
| 3,671,917 | 6/1972 | Ammon et al. | 339/17 L |

*Primary Examiner*—Roy D. Frazier
*Assistant Examiner*—Lawrence J. Staab
*Attorney, Agent, or Firm*—Clegg, Cantrell & Crisman

[57] ABSTRACT

An apparatus for making connection with the contact fingers on the edge of a printed circuit card. Strips of contact terminals, wherein adjacent terminals include shank and tail portions offset in opposite directions, are press fitted into a substrate having holes therein arranged in a staggered grid array. An insulative housing having openings in the sidwalls to receive portions of the offset contact terminals is laid over the press fitted terminals and held in position by engagement therewith. The layover insulative housing also includes an entryway for receiving a printed circuit card to be terminated by the contact terminals of the connector.

8 Claims, 8 Drawing Figures

PRINTED CIRCUIT BOARD CONNECTOR HAVING CONTACTS ARRANGED IN A STAGGERED GRID ARRAY

BACKGROUND OF THE INVENTION

1. Field of the Invention

The invention relates to a connector for contact fingers on a printed circuit card, and more particularly, the invention pertains to a printed circuit board edge connector having offset contact terminals fitted directly into a substrate in a staggered grid pattern.

2. History of the Prior Art

One type of connector used in interconnecting backpanels for printed circuit cards is that shown and claimed in U.S. Pat. No. 3,671,917. Such connectors include rows of contact terminals pressfitted into a substrate and then covered by insulative housings to form adjacent rows of connectors. The holes in the substrate for receiving the contact terminals may be plated through and interconnected with one another by means of printed circuit paths lying on the surface of the substrate and extending between adjacent ones of the contacts. In the past, these connectors have been assembled in rectangular arrays with terminal receiving holes arranged in pairs of parallel linear rows. Each one of the linear rows is spaced from the other row of the pair while each pair of rows is spaced from the adjacent pair a sufficient distance to provide clearance between insulators placed over adjacent pairs of rows. The arrangement of contacts in parallel linear pairs of rows requires considerable crowding between contact pads in the same row on the substrate and thereby restricts the number of etched lines which may be placed between adjacent contact pads. Further, prior art connector arrays having layover insulators have been limited in the spacing between adjacent insulators by unnecessary thicknesses of adjacent sidewalls as well as the requirement for sufficient space to insert an insulator removal tool down between insulators.

For certain applications of connectors having contacts fitted directly into a substrate, it is desirable to maximize the spacing between adjacent contact terminal tails in a press fitted contact connector having a layover insulator. For example, when printed circuit wiring paths are used to interconnect selected contacts it may be required to route several different, isolated paths between two adjacent terminals. With prior art connectors having linear grid contact arrays fitted directly into a substrate, the contact terminals may be too close together to permit passage of the desired number of etched circuit paths. On the other hand, staggered grid contact arrays, such as those used in the present invention, increase the working space between adjacent contact shanks. In order to get as close spacing as practicable between adjacent insulators with a staggered grid contact array, the insulator of the present invention is formed with apertures in the side wall thereof. The insulator used in the connector of the present invention increases the number of connectors which may be placed on a given size substrate by decreasing the required spacing between adjacent insulators and at the same time, retains the repairability features of a removable insulator connector.

The printed circuit board connector of the present invention is constructed by first forming strips of contact terminals wherein the shanks of alternate terminals are transversely offset in opposite directions. The contact terminals are press fitted into a staggered grid pattern of receiving apertures in a printed circuit board. The press fitted contacts are then separated from one another and pairs of rows are covered by layover insulative housings. Each housing includes a plurality of slots formed in the lower portion of its outer walls to receive the offset connector portions press fitted into the staggered grid holes. The offset contact terminal connector of the present invention provides spacing between adjacent ones of the contacts greater than that of prior art connectors having contacts fitted directly into a substrate and, at the same time, increases the connector packing density of prior art staggered grid connectors by decreasing the required spacing between adjacent ones of the insulators.

SUMMARY OF THE INVENTION

The invention relates to an edge connector for printed circuit cards having offset contact terminals press fitted into staggered grid hole arrays and covered by a layover insulative housing. More particularly, the invention involves a printed circuit card edge connector including a mounting board and a plurality of staggered holes therein. Contact terminals are fitted into the holes and an insulative housing covers the terminals. The insulative housing includes slots for receiving the offset portions of the contacts and an entryway at the top for receiving a printed circuit card.

BRIEF DESCRIPTION OF THE DRAWINGS

For a more complete understanding of the present invention and for further objects and advantages thereof, reference may now be had to the following description taken in conjunction with the accompanying drawing, in which.

DETAILED DESCRIPTION

Figure 1:
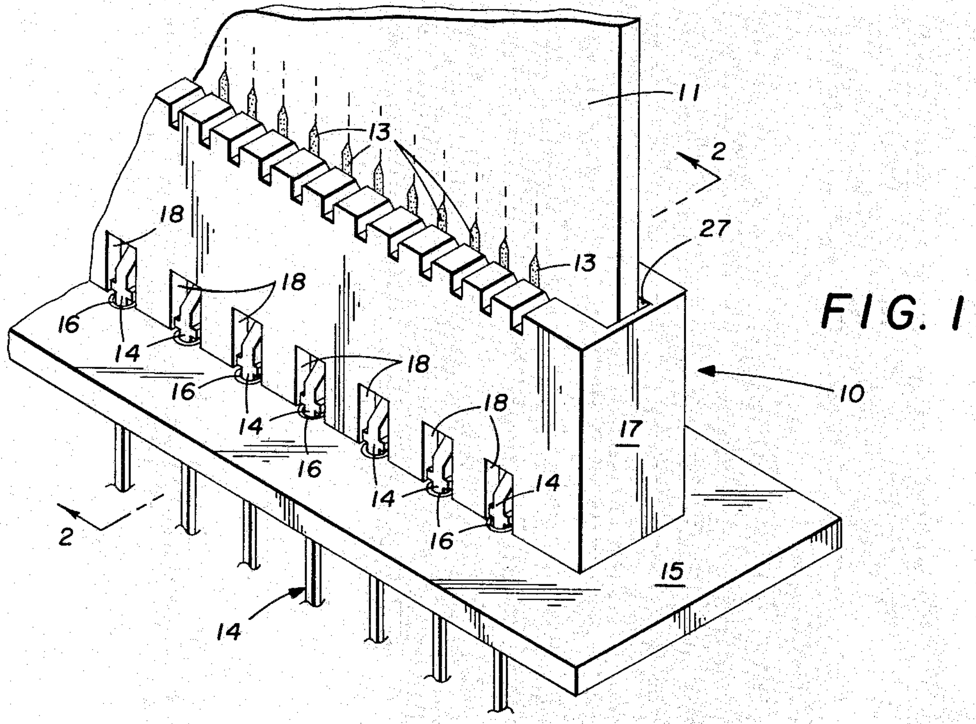
FIG. 1 is a perspective view of a portion of the connector of the present invention.

Referring to FIG. 1, there is shown a printed circuit card edge connector 10, constructed in accordance with the invention. The connector 10 is shown with a printed circuit card 11 inserted into a top opening therein. The card 11 mounts a plurality of electronic circuit components (not shown) which are connected to an array of plated edge finger terminations 13. The fingers 13 are deposited on the card edge by conventional printed circuit techniques and are electrically connected to those points of the card circuitry which must be interconnected to external circuits. The function of the connector 10 is to terminate and provide electrical connection to the plated card edge fingers 13 by means of a plurality of conductive metal contact terminals 14, one contact for each finger 13. The connector 10, shown in FIG. 1, is arranged to terminate a printed circuit card having contact fingers 13 on both the front and rear surfaces of the edge.

The connector 10 includes a substrate 15 which may comprise a conventional printed circuit board having a plurality of rows of holes 16 formed therein. The contact terminals 14 are rigidly mounted to the substrate 15 by press fitting them into the holes 16, preferably in accordance with the technique shown and claimed in U.S. Pat. No. 3,676,926. In the connector of the present invention the holes 16 are arranged in rows on a staggered grid pattern to increase the distance between adjacent holes and, hence, increase the working space between adjacent contacts. The mounted contacts 14 are then substantially enclosed by a layover insulative housing 17 which includes a plurality of spaced slots 18 for receiving portions of the contact terminals 14. In one embodiment of the invention, the holes 16 may be plated through and the present connector used with a multi-layer, interconnecting backpanel as disclosed and claimed in U.S. Pat. No. 3,660,726.

Figure 2:
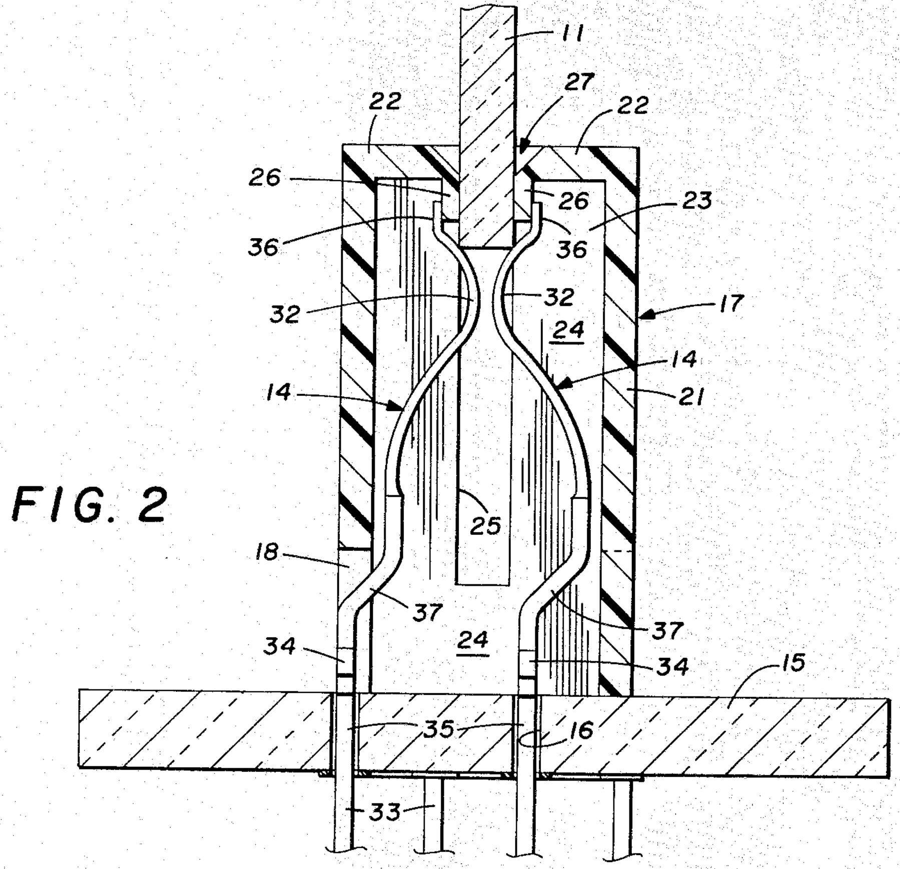
FIG. 2 is a vertical cross-section view taken about lines 2—2 of FIG. 1.

Referring now to FIG. 2, there is shown a cross-section view of the connector 10 illustrating a pair of contact terminals 14 press fitted into the receiving holes 16 and substantially enclosed by the insulative housing 17. The housing 17 is preferably formed of a moldable insulative material such as nylon, plastic or a polycarbonate material and includes an outer shell 21 which is open at the bottom to allow the shell to fit down over and receive the terminals 14. The upper portion of the shell 21 is partially closed by two U-shaped edge sections 22 to define a top opening 27 through which a printed circuit card edge 11 can be inserted to engage the contact terminals 14. The housing 17 is preferably divided into a plurality of internal chambers 23 by transversely extending wall sections 24, each of which includes a central slot 25 for receiving a printed circuit card. The slots 25 in adjacent wall sections 24 together define a printed circuit card receiving plane. Each of the chambers 23 receives a pair of contact terminals 14 when the insulative housing 17 is laid over the terminal ends. An overhanging lip 26 is formed on the innermost portion of the U-shaped sections 22 to contact and support the ends of the terminals 14. The lower sidewalls of the insulative shell 21 includes alternate slots 18 to receive the offset portions 37 of the outermost contact terminals 14.

Figure 3:
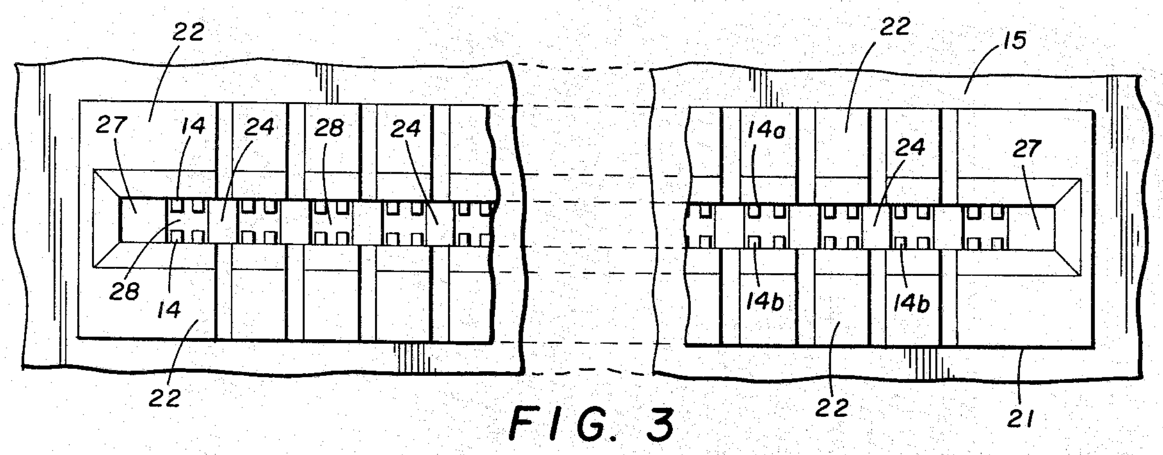
FIG. 3 is a top view of the connector of the present invention.
Figure 4:
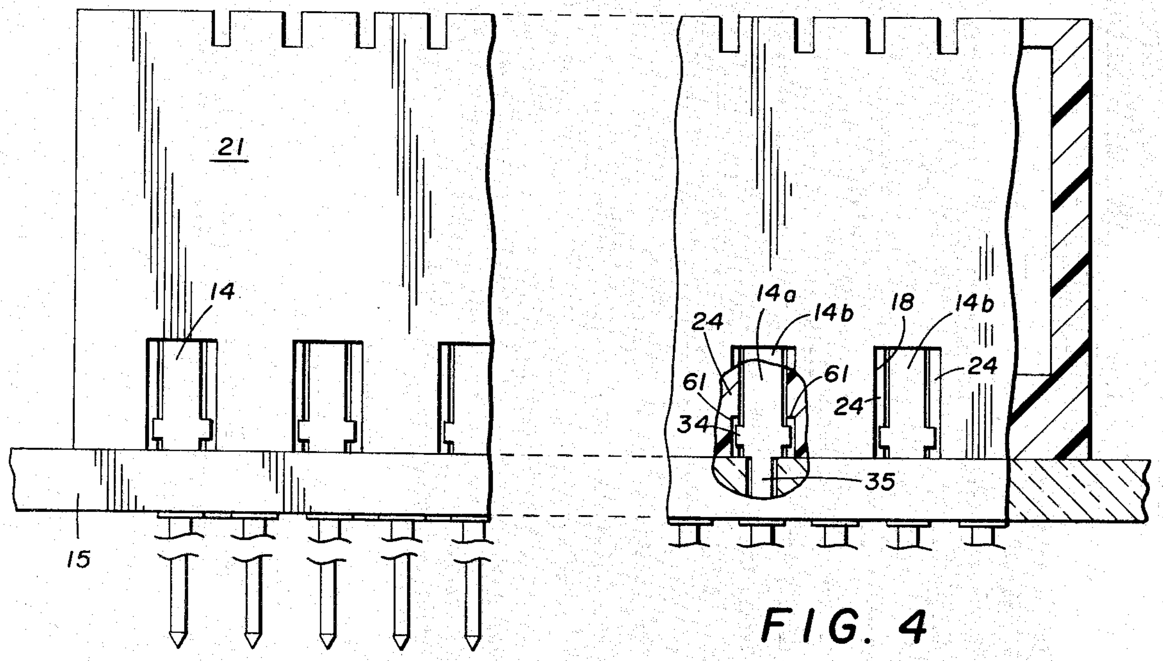
FIG. 4 is a side view of the connector of the present invention.
Figure 5:
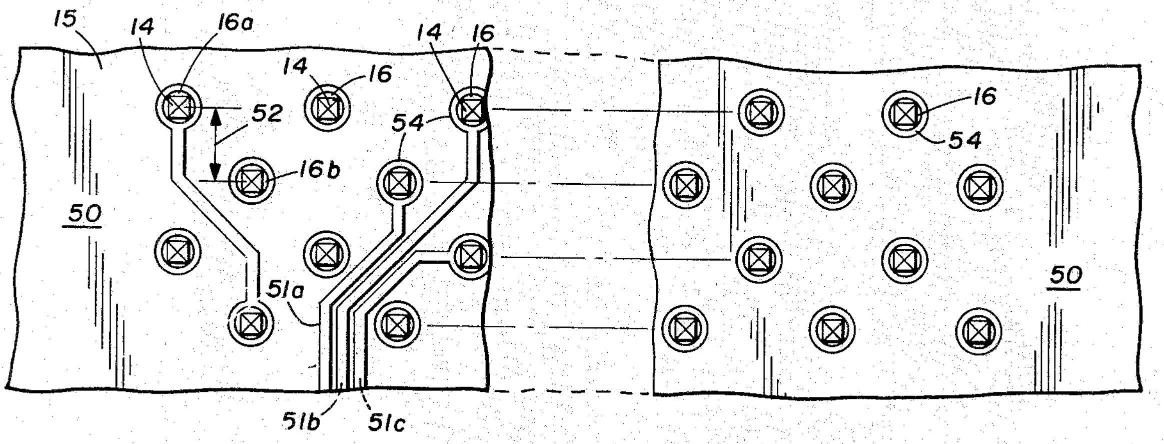
FIG. 5 is a bottom view of the connector of the present invention illustrating the staggered grid contact terminal pattern used.

FIGS. 3–5 show, respectively, top, side and bottom views of a connector assembled in accordance with the present invention. Referring to the under surface 50 of the substrate 15, shown in FIG. 5, it may be seen how the holes 16, into which the contacts 14 are mounted, are arranged in a staggered grid pattern. Alternate holes 16a and 16b are spaced from a linear row by a hole offset distance denoted by the arrow 52. In one embodiment of the present connector system, circuit paths are placed on the under surface 50 of the substrate 15 to interconnect or provide external connection to selected ones of the contact terminals 14. Arranging the contacts in a staggered grid pattern increases the distance between adjacent holes (i.e., adjacent contact pads 54 surrounding the holes 16) and consequently allows passage of a larger number of circuit paths, such as 51a–51c, therebetween. In certain configurations the use of a staggered grid hole pattern increased the distance between adjacent contact pads 54 by over 40 percent.

Figure 7:
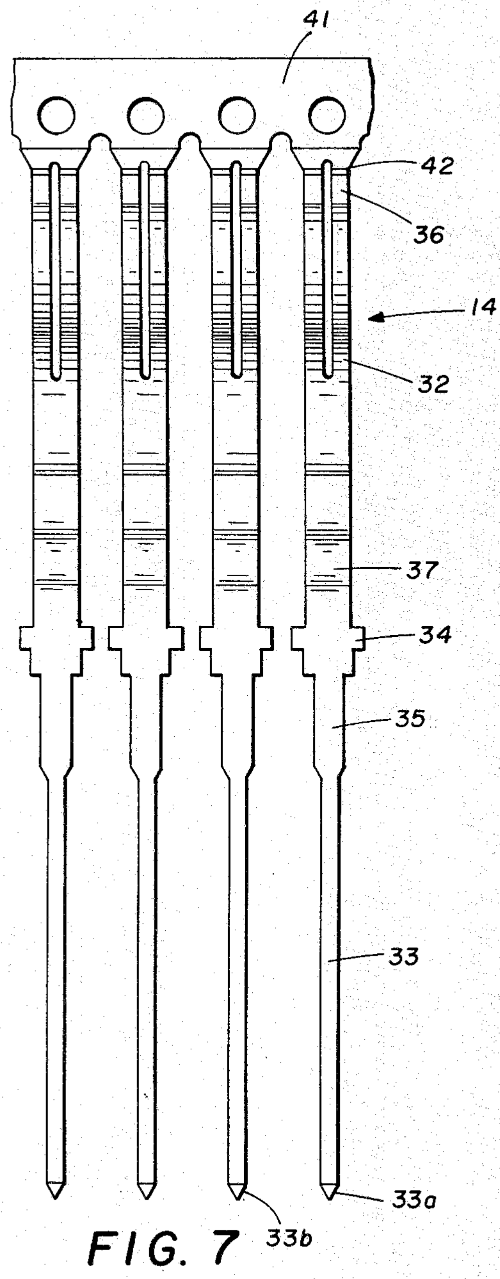
FIG. 7 is a front view of a plurality of strip mounted offset contact terminals used in conjunction with the invention.
Figure 8:
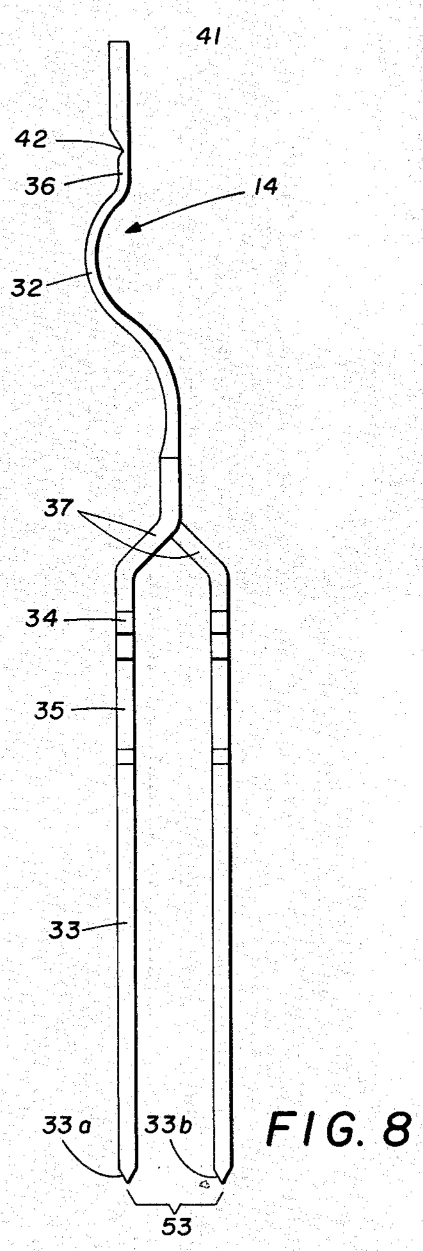
FIG. 8 is an end view of the strip of contact terminals shown in FIG. 7.

Referring now to FIGS. 7 and 8 there are shown, respectively, front and side views of a strip of contact terminals 14. The terminals are preferably stamped from a single long thin strip of metal, such as phosphor-bronze, and then finished by plating them with a layer of nickel and an outer layer of gold, or some other acceptable contact plating. Each of the contact terminals 14 are joined to a common support strip 41 by a beveled reduced section 42.

Each one of the contact terminals 14 comprises a connector portion 32 and a shank portion 33 which are separated by a shoulder 34 and an enlarged neck section 35 which is greater in width than the shank. The neck section 35 of the contact 14 is enlarged to such a width that when a contact is press fitted into a contact receiving hole 16, there is a tight frictional engagement between the neck section 35 and the walls of the hole so that the contact is held rigid and motionless. The shoulder 34 limits the depth to which a contact 14 may be pressed into the board while the shank portion 33 of the contact is substantially square in cross section to permit termination by such techniques in wire wrapping.

The connector portion 32 of the contact terminals 14 is curved into a bowed configuration and is terminated at its upper end by a flange portion 36. The bowed connector portion 32 is bifurcated to provide a secure, positive, redundant engagement with the printed circuit board edge finger terminations.

Between the bowed connector portion 32 and the shoulder portion 34 of each contact terminal 14 there is located an offset section 37. The offset section 37 of each contact 14 is formed so that the shank portions 33_a_ and 33_b_ of adjacent contacts on a strip are offset a selected distance 53 while the bowed portions 32 of the adjacent contacts are aligned. The shank offset distances 53 are the same as the hole offset distances 52 in the staggered grid hole pattern shown in FIG. 5. After press fitting the neck sections of the contacts into the staggered grid holes, the offset sections 37 space the bowed portions 32 of opposed contact pairs into a closely spaced facing relationship.

Referring again to FIG. 3, there is shown a top view of an assembled connector constructed in accordance with the invention. The upper surface of the U-shaped edge sections 22 of the layover insulator 21 surrounds the top printed circuit card insertion opening 27. Each of the opposed pairs of bifurcated contact terminals 14 are located in a chamber 28 and separated from adjacent pairs by the slotted wall sections 24. The offset sections of the contact terminals 14 position the bowed portions of opposed contact pairs in closely spaced, opposed relationships along the printed circuit card receiving plane.

As shown in FIG. 4, a side view of the assembled connector illustrates the spaced slots 18 in the side walls of the insulative shell 21. Each of the slots 18 is formed to receive with clearance the full width of a contact terminal 14, which is greater than the distance between the adjacent wall sections 24. The cutaway inset in FIG. 4 shows a view of the innermost contact terminal 14a located behind the outermost contact terminal 14b which is visible through the slot 18. The insulative housing 21 is held in position by frictional engagement of the shoulder portions 34 with securing grooves 61 formed on the lower edges of the wall sections 24.

Figure 6:
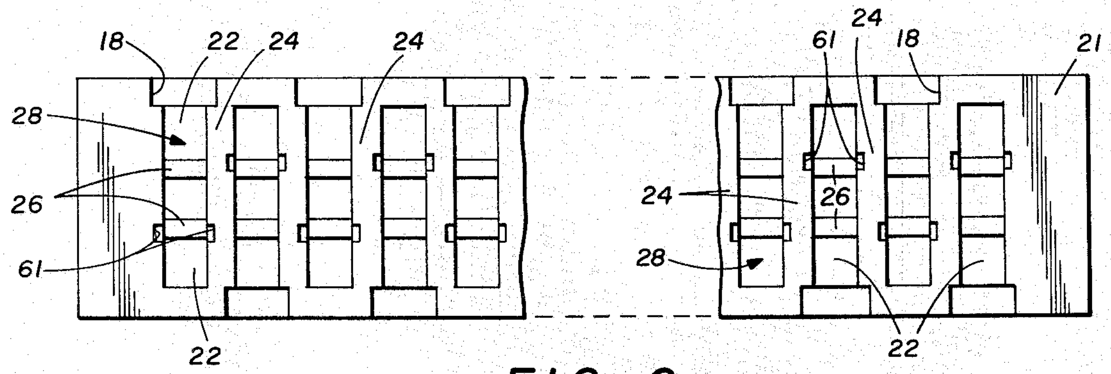
FIG. 6 is a bottom view of the insulative housing used in the connector of the present invention.

Referring next to FIG. 6, there is shown a bottom view of the insulative shell 21, removed from the connector assembly. In this view, it can be seen how the adjacent contact pair receiving cavities 22 are separated from one another by the wall sections 24. The slots 18 are positioned around the sides of the shell to receive the outermost contact terminal of each pair. The slots 18 also provide a convenient gripping edge for removing the insulative shell 21. The grooves 61 are positioned to frictionally engage the shoulder portion of the innermost contact of each pair to hold the insulator in position, enclosing the contacts.

The connector of the present invention is assembled by separating the required number of offset contact terminals 14, shown in FIGS. 7 and 8, and inserting the shanks thereof into receiving holes 16 arranged in a staggered grid pattern as illustrated in FIG. 5. The contacts 14 are then press fitted into the holes to form two rows of contact terminals. The receiving holes 16 into which the opposed contact terminal pairs are inserted are spaced from one another so that the bowed sections of the contactor portions 32 of opposed terminal pairs are separated from one another a distance less than the thickness of the printed circuit cards to be connected. The insulative housing 21 is then laid over the upper ends of the contact terminals to receive opposed pairs of contacts up into the chambers 28. When the housing 21 is initially placed over the contact terminals 14, it comes to rest with the ends of the overhanging lip portions 26 in contact with the ends of the flange portions 36, as can be visualized from FIG. 2. The insulative housing 21 is placed in final position by camming the contact terminals 14 apart and pressing the housing downwardly, as taught in U.S. Pat. No. 3,671,917. In the finally assembled connector, the flanges 36 rest against the inside edges of the overhanging lip portions 26 and exert a preselected loading force against them as shown in FIG. 2.

When a printed circuit card is plugged into the top opening 27 of the finished connector, the fingers 13 on the edges of the card are engaged with a preselected force by the bowed sections 32 of the terminals 14. This ensures a positive electrical connection between the card and the contact terminals. As shown in FIG. 1, the completed connector is used by inserting a printed circuit card 11 having termination fingers 13 thereon into the top opening 27. The connector portions 32 of the terminals 14 frictionally engage the fingers 13 and provide electrical connection to external circuitry (not shown) which is interconnected via the shanks 33 of the terminals 14.

From the foregoing description of the present invention, it may be seen how the use of a staggered grid hole pattern and offset contact terminals permit a wider spacing between adjacent holes and hence more working room at the base of the contact, e.g., for a larger number of printed wiring paths or more room to receive wire-wrap equipment. The structure of the insulator of the connector of the present invention also allows a greater packing density of insulative shells in an interconnecting backpanel because the slots in the sides of the insulator permits connectors to be spaced closer together than in prior art staggered grid arrangements. Moreover, the slots in the insulator used in the present invention reduces the overall width thereof by approximately twice the insulator wall thickness and, at the same time, provides a gripping edge for an insulator removing tool.

Having described the invention in connection with certain specific embodiments thereof, it is to be understood that further modifications may now suggest themselves to those skilled in the art and it is intended to cover such modifications as fall within the scope of the appended claims.

What is claimed is:

1. An edge connector for a printed circuit card which comprises:

a planar substrate formed with a plurality of apertures therethrough, said apertures being arranged in pairs in staggered alignment along said substrate;

a plurality of contact terminals supported within said apertures, each of said contacts including a bowed portion resilient in a direction transverse to the axis of the associated aperture and spaced therefrom by an offset portion, said contacts associated with each pair of apertures being arranged with the bowed portions thereof in closely spaced facing relationship; and an insulative housing substantially enclosing said contacts and including a pair of parallel, longitudinal sidewalls, each formed with a plurality of recesses for receiving the offset portions of selected ones of said contacts and a plurality of transversely extending wall sections separating each contact pair, adjacent ones of said wall sections being frictionally engageable with selected others of said contacts for frictionally retaining said housing in enclosing relationship with said contacts.

2. An edge connector as set forth in claim 1 wherein the offset portions of the contacts of each contact pair are offset in the same direction and the offset portions of adjacent pairs of contacts are offset in opposite directions.

3. An edge connector as set forth in claim 2 wherein one contact of each contact pair is receivable in a recess while the other contact of each contact pair is frictionally engageable with its associated adjacent wall sections.

4. An edge connector as set forth in claim 1 wherein said plurality of recesses comprise slots which extend through said sidewalls.

5. An edge connector as set forth in claim 2 wherein the bowed portions of all the contact pairs are in alignment, with the bowed portions of each contact pair being spaced on opposite sides of a printed circuit card receiving plane and wherein each of said recesses in said wall sections comprises an elongated depending slot subtending said printed circuit card receiving plane, the lowermost portion of said slot being aligned with said offset portions of said contacts.

6. An edge connector as set forth in claim 3 wherein the contact of each contact pair which is frictionally engageable with said wall sections is formed with a wall section-engaging shoulder below its offset portion and said adjacent wall sections associated therewith are formed with grooves for receiving said shoulder.

7. An improved printed circuit card edge connector of the type including a planar substrate formed with a plurality of pairs of contact receiving apertures therealong, a plurality of contacts each including a portion press-fitted into one of said apertures in said substrate, and a bowed portion resilient in a direction transverse to the axis of an associated aperture, the bowed portions of the contacts associated with each aperture being in closely spaced facing relationship on the opposite sides of a card-receiving plane and an insulative housing having bottom openings of sufficient size to receive the bowed portions of said contacts and a top opening to receive the printed circuit board, said housing being placed down over said press-fitted contacts to substantially enclose said contacts, wherein the improvement comprises:

adjacent ones of said pairs of apertures being arranged in offset staggered relationship, with one aperture on each pair on opposite sides of said card-receiving plane;

each of said contacts having an offset portion between said bowed portion and said press-fitted portion, the offset portions of each pair of contacts being offset in the same direction, the offset portions of adjacent pairs of contacts being offset in opposite directions; and said housing is formed with a plurality of recesses for receiving the offset portions of selected ones of said contacts.

8. The improved edge connector set forth in claim 7 wherein the offset portion of one contact of each pair is offset in a direction toward its bowed portion and the offset portion of the other contact of each pair of contacts is offset in a direction away from its bowed portion.

* * * * *